(12) United States Patent
Ogane

(10) Patent No.: US 6,418,074 B1
(45) Date of Patent: Jul. 9, 2002

(54) SEMICONDUCTOR MEMORY DEVICE HAVING DRIVER CIRCUIT WHICH SUPPLIES TEMPORARY ACCELERATED CHARGE

(75) Inventor: Junichi Ogane, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 47 days.

(21) Appl. No.: 09/793,142

(22) Filed: Feb. 27, 2001

(30) Foreign Application Priority Data

Oct. 5, 2000 (JP) ........................................ 2000-306153

(51) Int. Cl.⁷ ................................................ G11C 7/00
(52) U.S. Cl. .............. 365/204; 365/185.01; 365/230.06
(58) Field of Search ....................... 365/185.01, 185.23, 365/185.25, 185.26, 204, 230.06

(56) References Cited

U.S. PATENT DOCUMENTS 5,592,427 A * 1/1997 Kumakura et al. ......... 365/205
5,748,535 A * 5/1998 Lee et al. ............... 365/185.06
6,014,329 A * 1/2000 Akaogi et al. ......... 365/185.09
6,064,606 A * 5/2000 Kuroda et al. ............... 365/200

FOREIGN PATENT DOCUMENTS

JP 09-115292 5/1997

* cited by examiner

*Primary Examiner*—David Nelms
*Assistant Examiner*—Thong Le
(74) *Attorney, Agent, or Firm*—Volentine Francos, PLLC

(57) ABSTRACT

It is an object of the invention to provide a flash memory with a fast reading speed and good read disturb resistance. This flash memory comprises a memory cell block having FAMOS transistors arranged in a matrix form; a plurality of word lines connected to the control gates of transistors in the same row; a plurality of bit lines connected to the drains of transistors in the same column; a source line connected in common to the sources of all transistors; and a driver circuit for charging the source line. The driver circuit charges the source line and not the bit line when reading data. In addition, the driver circuit performs accelerated charging at the start of charging the source line and thereafter performs normal charging.

18 Claims, 6 Drawing Sheets

SEMICONDUCTOR MEMORY DEVICE HAVING DRIVER CIRCUIT WHICH SUPPLIES TEMPORARY ACCELERATED CHARGE

BACKGROUND OF THE INVENTION

1. Field of the Invention

The present invention relates to a semiconductor memory device, such as flash memory, for example.

2. Description of Related Art

Flash memory is known as a type of semiconductor memory device. The memory cells in flash memory each have a FAMOS (floating gate avalanche metal oxide semiconductor) transistor. These memory cells are normally arranged in a matrix formation.

General purpose flash memory comprises a plurality of word lines disposed in rows, a plurality of bit lines disposed in columns, and a single source line. This source line is grounded. Each FAMOS transistor is connected by the control gate to the corresponding word line, by the drain terminal to the corresponding bit line, and by the source terminal to the source line.

The rewriting of stored data is performed by injecting charge from the drain to the floating gate, or by discharging charge from the floating gate to the drain. When the rewrite control potential is applied to the word line, injection or discharge of charge by the floating gate is effected depending on the potential of the bit line and the stored data is rewritten thereby.

The reading of stored data is performed by applying the read control potential to the word line after the bit line is charged to the reference potential. When the read control potential is applied to the word line, the FAMOS transistor with charge stored in the floating gate becomes on and the FAMOS transistor without charge stored in the floating gate is kept in an off state. In the case where the FAMOS transistor is on, the charge in the bit line is discharged to ground through the source line and therefore the potential of the bit line becomes 0 V. Meanwhile, in the case where the FAMOS transistor is off, the potential of the bit line does not change. The potential of the bit line is output as the read data.

The rewriting speed for flash memory increases in proportion to the increase in the FN current density of the FAMOS transistor. The FN current density is the density of the current flowing between the floating gate and the n type drain.

However, when a FAMOS transistor is constituted so as to have a high FN current density, the read disturb resistance of the FAMOS transistor becomes poor. Read disturb resistance is the resistance to variation in the amount of charge stored when data are read. When the FN current density is increased, injection and discharge of charge in the floating gate occur easily when data are read. Poor read disturb resistance results in reduced reliability of the stored data.

SUMMARY OF THE INVENTION

It is an object of the present invention to provide a semiconductor memory device with high writing speeds and good read disturb resistance.

For this reason, the semiconductor memory device relating to the present invention comprises: a memory cell block having floating gate transistors arranged in a matrix; a plurality of first selector lines each connected to the control gates of the transistors in the same row; a plurality of second selector lines each connected to the first terminals of transistors in the same column; a common line connected to the second terminals of transistors in a plurality of rows or a plurality of columns; and a driver circuit for performing normal charging for supplying the read potential to the common line, and accelerated charging for temporarily increasing the quantity of the charge supplied to the common line.

The semiconductor memory device relating to the present invention charges the common line, not the second selector line with the driver circuit when data are read. Consequently, even if the current density between the first terminal and the floating gate is made higher, that is, even if the writing speed is made faster, the read disturb resistance of the transistor will not become poor.

In addition, in the semiconductor memory device relating to the present invention, the driver circuit has an accelerated charging function. Consequently, the reading time becomes short because the common line can be charged in a short period of time.

BRIEF DESCRIPTION OF THE DRAWINGS

Other objects and advantages of the present invention are explained with reference to the following appended drawings.

DESCRIPTION OF THE PREFERRED EMBODIMENTS

Figure 1:
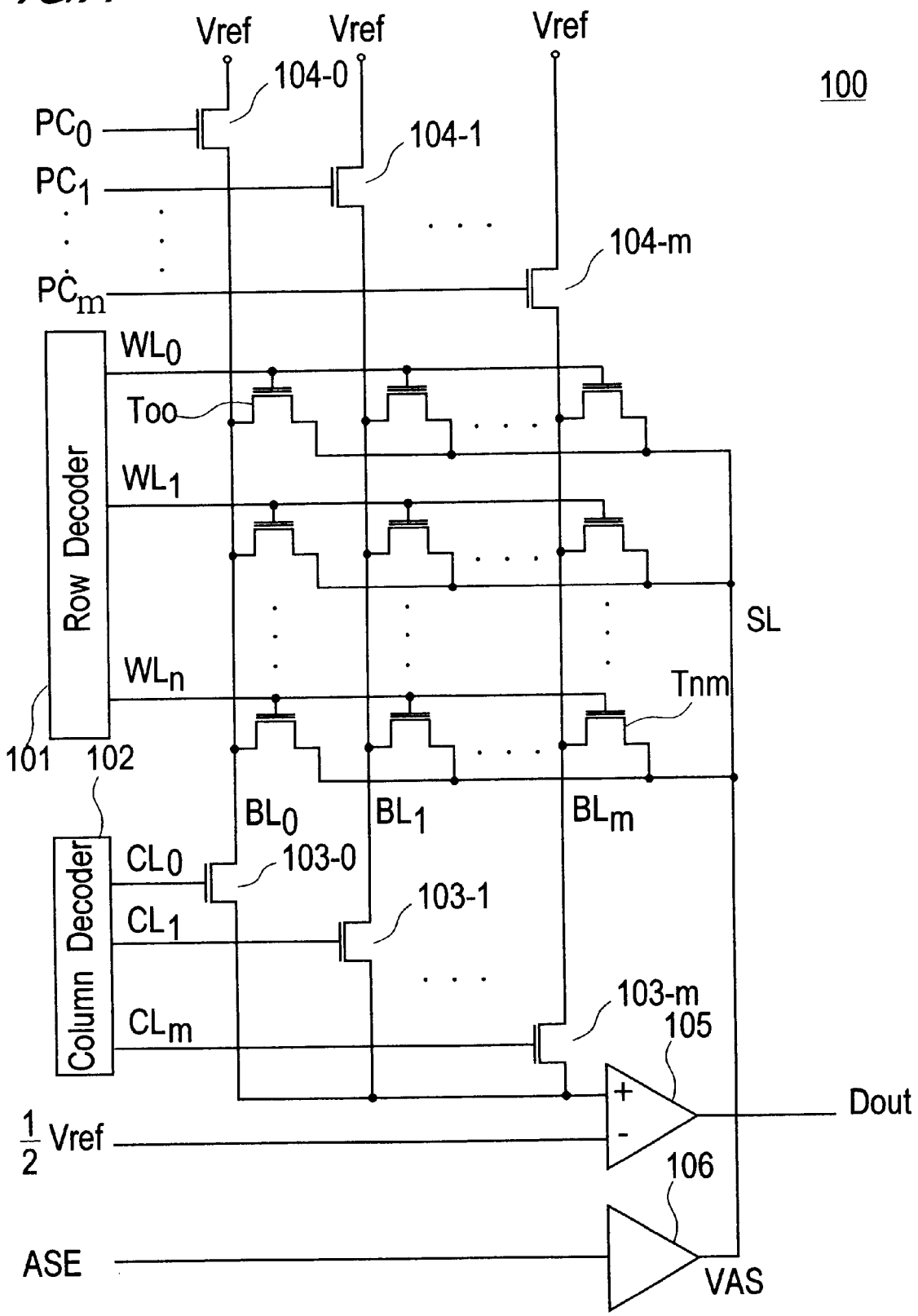
FIG. 1 is a circuit diagram showing the general constitution of the flash memory relating to the first and second embodiments.

The preferred embodiments of the present invention are explained below using the drawings. In the drawings, the sizes, forms, and arrangement of the various elements are only shown so that the present invention can be understood. Moreover, the numerical conditions explained below are merely for illustration.

First Embodiment

The first embodiment is explained below using FIGS. 1 through 3 and uses an example wherein the present invention is applied to flash memory.

This embodiment is an example wherein charging is accelerated when the reading of stored data starts.

FIG. 1 is a circuit diagram showing the constitution of the flash memory 100 relating to the present embodiment. As shown in FIG. 1, this flash memory 100 comprises: FAMOS transistors T00 through Tnm as memory cells, a row decoder 101, a column decoder 102, nMOS transistors 103-0 through 103-m for column control, nMOS transistors 104-0 through 104-m for data writing, a sense amplifier 105, a source line driver circuit 106, word lines WL0 through WLn, bit lines BL0 through BLn, a source line SL, and column control lines CL0 through CLn.

The FAMOS transistors T00 through Tnm are connected by the control gates to the corresponding word lines WL0 through WLn, by their drains to the corresponding bit lines BL0 through BLn, and by their sources to the common source line SL.

The row decoder 101 receives row address data from outside the system. The row decoder 101 then applies high-level voltage to the word line corresponding to this row address data, from among the word lines WL0 through WLn and applies low level voltage to the other word lines.

The column decoder 102 receives column address data from outside the system. The column decoder 102 then applies high-level voltage to the column control line corresponding to this column address data, from among the column control lines CL0 through CLn, and applies low level voltage to the other column control lines.

The column control transistors 103-0 through 103-m are connected by their gates to the corresponding column control lines from among column control lines CL0 through CLn and by their sources to the corresponding bit lines from among the bit lines BL0 through BLn. The drains of the column control transistors 103-0 through 103-m are connected to the non-inverting input terminal of the sense amplifier 105.

The data rewriting transistors 104-0 through 104-m receive pre-charge signals PC0 through PCm through their gates and the reference potential Vref through their sources. Also, the drains of the data rewriting transistors 104-0 through 104-m are connected to corresponding bit lines.

The sense amplifier is connected by the non-inverting input terminal to the drains of the transistors 103-0 through 103-m and receives the threshold potential Vref/2 (voltage value that is one half the reference potential Vref) from the inverting input terminal. The sense amplifier 105 make the output signal Dout to be high-level when the input potential of the non-inverting input terminal is higher and make the output signal Dout to be low-level when the input potential Vref/2 of the inverting input terminal is higher.

The source line driver circuit 106 outputs a driving voltage VAS for pre-charging the source line, when the drive control signal ASE input from the input terminal is high level.

Figure 2:
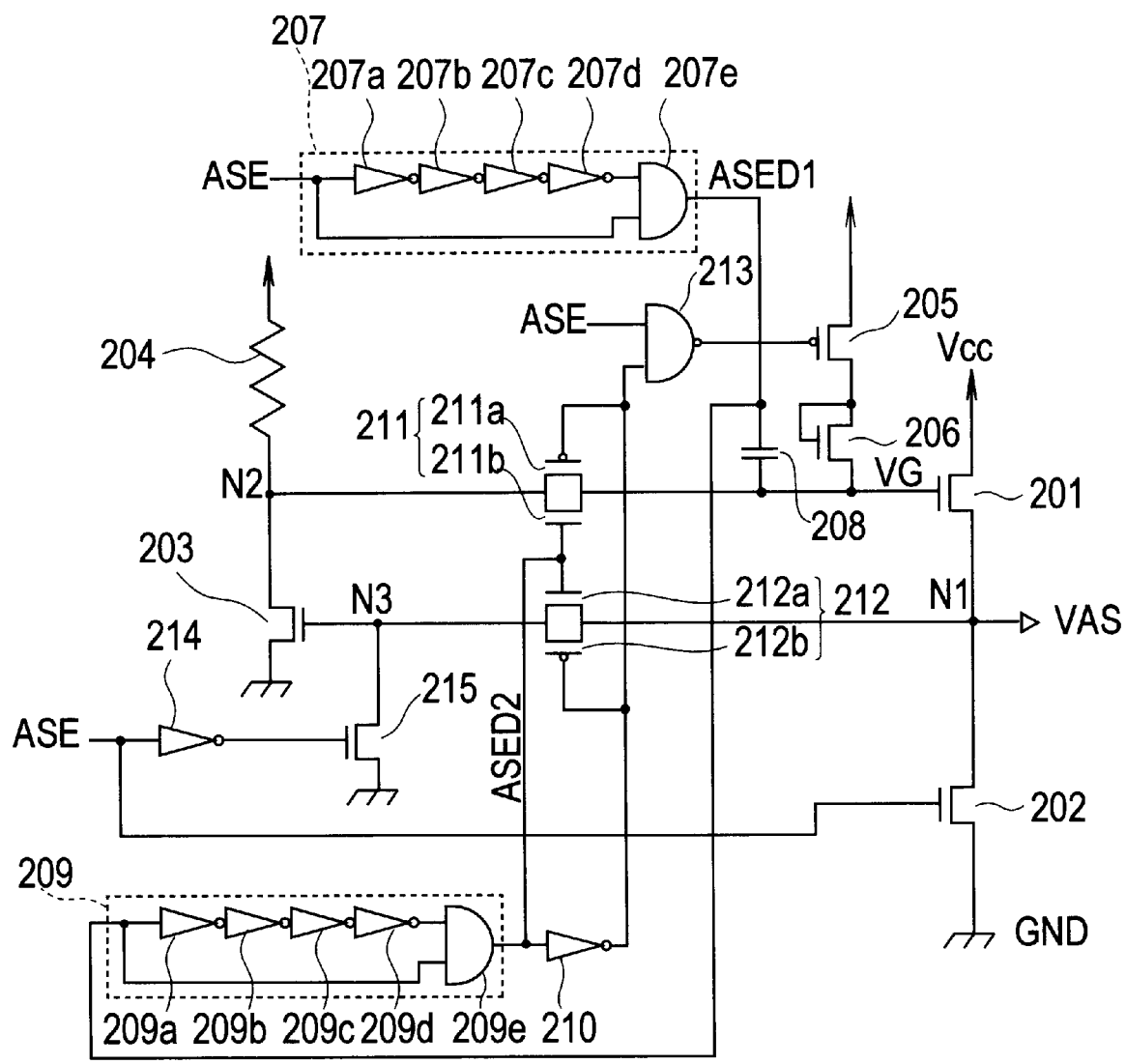
FIG. 2 is a circuit diagram showing the internal constitution of the driver circuit relating to the first embodiment.
Figure 3:
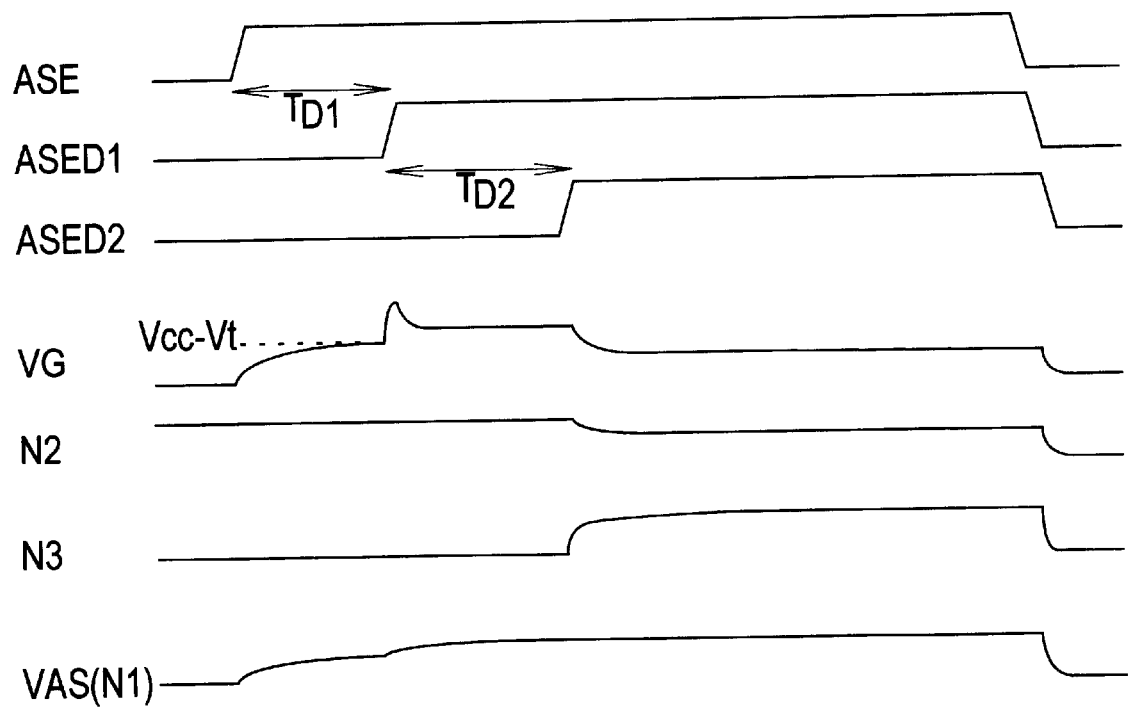
FIG. 3 is a timing chart for explaining the operation of the driver circuit relating to the first embodiment.

FIG. 2 is a circuit diagram showing an example of the internal constitution of the driver circuit 106.

In FIG. 2, the nMOS transistor 201 is connected by its gate to the node N2 through the transfer gate 211, by its source to the power line Vcc, and by its drain to the node N1. Also, the nMOS transistor 202 receives the drive control signal ASE through its gate, is connected to the ground line GND by its source, and to the node N1 by its drain. Here, the potential of the node N1 becomes the driving voltage VAS applied to the source line SL (see FIG. 1).

The nMOS transistor 203 is connected by its gate to the node N1 through the transfer gate 212, by its source to the ground line GND, and by its drain to the node N2. One end of a resistor element 204 is connected to the power line Vcc and the other end is connected to the node N2.

The pMOS transistor 205 is connected by its gate to the output terminal of a NAND circuit 213 and by its source to the power line Vcc. Also, the diode-connected nMOS transistor 206 is connected to the drain of the pMOS transistor 205 by its gate and drain and is connected to the gate of the nMOS transistor 201 by its source.

The delay circuit 207 comprises four serially connected NOT circuits 207a through 207d and an AND circuit 207e. From one input terminal, the AND circuit 207e receives the drive control signal ASE through the NOT circuits 207a through 207d and the drive control signal ASE is directly input from the other input terminal. With such a constitution, the delay from the NOT circuits 207a through 207d is applied only when the signal ASE rises. In the following explanation, the delay time by the delay circuit 207 is TD1.

One end of the capacitor 208 is connected to the output terminal of the delay circuit 207 and the other end is connected to the gate of the nMOS transistor 201.

The delay circuit 209 comprises four serially connected NOT circuits 209a through 209d and an AND circuit 209e. One input terminal of the AND circuit 209e is connected to the output terminal of the delay circuit 207 through the NOT circuits 209a through 209d. Meanwhile, the other input terminal of the AND circuit 209e is directly connected to the output terminal of the delay circuit 207. In the following explanation, the delay time by the delay circuit 209 is TD2.

The input terminal of the NOT circuit 210 is connected to the output terminal of the delay circuit 209.

A transfer gate 211 comprises a pMOS transistor 211a and an nMOS transistor 211b. The pMOS transistor 211a is connected by its gate to the output terminal of the NOT circuit 210, by its source to the node N2, and by its drain to the gate of the nMOS transistor 201. The nMOS transistor 211b is connected by its gate to the output terminal of the delay circuit 209, by its source to the gate of the nMOS transistor 201, and by its drain to the node N2.

A transfer gate 212 comprises an nMOS transistor 212a and a pMOS transistor 212b. The nMOS transistor 212a is connected by its gate to the output terminal of the delay circuit 209, by its source to the gate of the nMOS transistor 203, and by its drain to the node N1. The pMOS transistor 212b is connected by its gate to the output terminal of the NOT circuit 210, by its source to the node N1, and by its drain to the gate of the nMOS transistor 203 in the node N3.

One input terminal of the NAND circuit 213 is connected to the output terminal of the NOT circuit 210 and the drive control signal ASE is input from the other input terminal of the NAND circuit 213.

The NOT circuit 214 inputs the drive control signal ASE from the input terminal. The nMOS transistor 215 is connected by its gate to the output terminal of the NOT circuit 214, by its source to the ground line GND, and by its drain to the node N3.

The operation of the flash memory 100 relating to the present embodiment is explained next with reference to FIG. 3.

When the read operation of the flash memory 100 is not being executed, the drive control signal ASE is maintained at low level. When the drive control signal ASE is low level, the output of the NAND circuit 213 is high level. For this reason, the pMOS transistor 205 is off and consequently the pMOS transistor 205 does not supply potential to the gate of the nMOS transistor 201. Also, at this time, the transistors 211a, 211b, 212a, 212b are all off and therefore the potential of the node N2 is not supplied to the gate of the nMOS transistor 201 and the potential of the node N1 is not supplied to the gate of the nMOS transistor 203. Furthermore, because the output signal ASED1 of the delay circuit 207 is low level, the gate potential of the nMOS transistor 201 is maintained at low level through the capacitor 208 and consequently the nMOS transistor 201 is off. When the drive control signal ASE is low level, the nMOS transistor 202 has low level gate potential and is therefore off. For this reason, the potential of the node N1 is indeterminate. Meanwhile, because the output of the NOT circuit 214 is high level, the nMOS transistor 215 is on. Consequently, the gate potential of the nMOS transistor 203 becomes low level and therefore the nMOS transistor 203 is off. Consequently, the potential of the node N2 is Vcc.

At the start of the read operation for the flash memory 100, the drive control signal ASE is made high level. Pre-charging of the source line SL (see FIG. 1) is thereby executed as follows.

When the drive control signal ASE becomes high level, the nMOS transistor 202 is turned on. Next, the output of the NAND circuit 213 becomes low level and consequently the pMOS transistor 205 is turned on. Thereby, Vcc-Vt (Vt is the voltage drop across the nMOS transistor 206) is applied to the gate of the nMOS transistor 201. The nMOS transistor 201 is therefore turned on. With the abovementioned operations, the potential of the node N1, meaning the driving voltage VAS, rises to a value described by dividing the source voltage Vcc by the on resistance ratio of the nMOS transistors 201, 202. Also, when the drive control signal ASE becomes high level, the gate potential of the nMOS transistor 215 becomes low level; therefore, this nMOS transistor 215 is turned off and consequently the gate of the nMOS transistor 203 enters a floating state. At this time, the potential of the node N2 is maintained at Vcc.

Upon the elapse of time TD1 from when the drive control signal ASE became high level, the output signal ASED1 of the delay circuit 207 changes from low level to high level. Consequently, the potential at one end of the capacitor 208 rises abruptly from 0 V to Vcc. Accordingly, the potential of the other end of the capacitor 208 (meaning the gate potential of the nMOS transistor 201) also rises rapidly by Vcc and becomes 2Vcc-Vt; this potential slowly drops thereafter. Also, the charge supplied from the node N1 to the source line SL (see FIG. 1) is thereby rapidly increased. For this reason, the rise in the driving voltage VAS is accelerated. However, the source line SL has a very high load, and therefore the voltage VAS does not rise abnormally.

Upon the passage of time TD2 from when the signal ASED1 becomes high level, the output signal ASED2 of the delay circuit 209 changes from low level to high level. Accordingly, the transfer gates 211, 212 open (in other words, the transistors of the gates 211, 212 turn on) and then the output of the NAND circuit 213 becomes low level. Due to the opener of the transfer gates 211, 212, the gate of the nMOS transistor 203 is connected to the node N1 and the gate of the nMOS transistor is connected to the node N2. Meanwhile, because the output of the NAND circuit 213 becomes low level, the pMOS transistor 205 is turned off. Thereby, the gate potential of the nMOS transistor 201 becomes as provided by the node N2 and the gate potential of the nMOS transistor 203 becomes as provided by the node N1. As discussed above, the potential of the node N2 is Vcc at the time when the transfer gates 211, 212 become open, but drops once the nMOS transistor 203 is turned on by the potential of the node N1. Consequently, the drain current of the nMOS transistor 201 drops and therefore the potential of the node N1 drops. Once the potential of the node N1 has dropped, the drain current of the nMOS transistor 203 decreases and therefore the potential of the node N2 rises. Due to this negative feedback action, the potential of the node N1, meaning the driving voltage VAS, converges on a value determined by the dimension of the nMOS transistors 201, 202, 203 and the resistor element 204.

When the pre-charging of the source line SL is executed in this way, data are then read from the FAMOS transistor. The method of reading stored data is similar to the method relating to previous flash memory, excluding that the pre-charging is not executed to bit lines BL0 through BLm but executed to source line SL.

The relationship between the FN current density and read disturb resistance in the flash memory in FIG. 1 is explained next.

Figure 6:
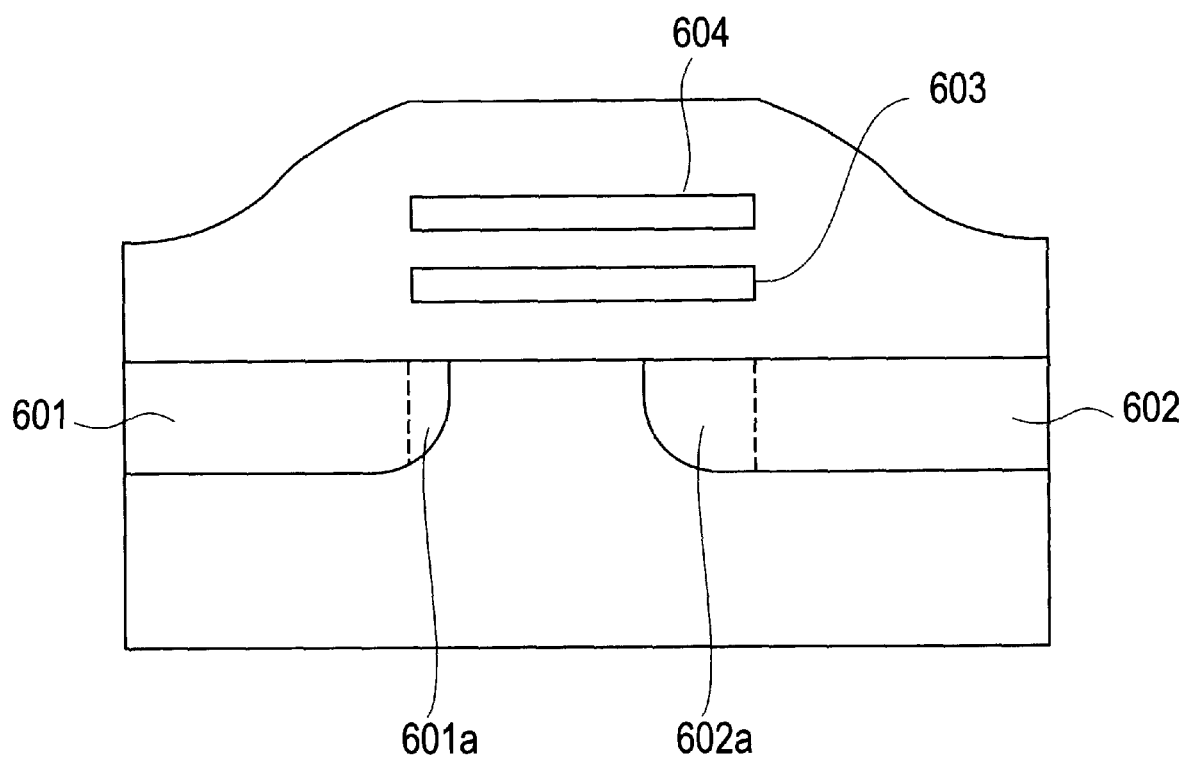
FIG. 6 is a cross sectional view showing an schematically illustration of the constitution of a FAMOS transistor.

FIG. 6 is a drawing showing the cross sectional structure of a FAMOS transistor. As shown in FIG. 6, the FAMOS transistor comprises an n type source region 601, an n type drain region 602, a floating gate 603, and a control gate 604.

In order to increase the data rewriting speed for the FAMOS transistor, the FN current density, meaning the density of the current flowing between the n type drain region 602 and the floating gate 603, must be made high. For this reason, the area of the overlap portion 602a of the n type drain region 602 and the floating gate 603 may be made large by making the area of the n type drain region 602 larger. On the other hand, the area of the overlap portion 601a of the n type source region 601 and the floating gate 603 may be small because this area will not to affect the writing speed.

In the type of flash memory in which the bit lines are pre-charged and the source line is grounded, the read disturb resistance deteriorates for the following reasons when the area of the overlap portion 602a of the FAMOS transistor is made large.

In order to increase the area of the overlap portion 602a, the area of the n type drain region 602 must be made large. The n type drain region 602 is generally formed using diffusion techniques and therefore must have a high concentration of impurities in order to have a large area. However, if the n type drain region 602 has a high concentration of impurities, injection or withdrawal of charge from the floating gate 603 occurs easily when a high voltage is applied to the drain in order to read the stored data, meaning when the bit lines are pre-charged. In other words, in this type of flash memory, the read disturb properties becomes worse in proportion to the increase in concentration of impurities in the n type drain region 602.

On the other hand, in the flash memory relating to the present embodiment, the source line, not the bit line, is charged during reading. For this reason, in the present embodiment, a high potential is applied to the n type source region 601 and not the n type drain region 602 during reading. Consequently, the impurities concentration of the n type drain region 602 is not related to the read disturb properties. In other words, in the present embodiment, the read disturb resistance does not deteriorate even when the writing speed is increased.

As shown in FIG. 1, the source line SL is connected to every FAMOS transistor T00 through Tnm in the memory cell array and consequently the junction volume is very high. For this reason, pre-charging for along period of time is required in the case of raising the potential of the source line SL to the reading potential using a normal driver circuit. In other words, pre-charging the source line SL with a normal driver circuit results in a new problem in that the reading speed becomes slow, although the writing speed and read disturb resistance are improved. One method for shortening the pre-charge time for the source line SL is to divide the source line by rows or columns and pre-charge only the source line corresponding to the FAMOS transistor that is being read. However, in the case where the source line is divided, a circuit for selecting each source line after the division becomes necessary and results in a large-scale circuit.

On the other hand, the driver circuit 106 in the present embodiment can temporarily increase the quantity of charge output when pre-charging starts and consequently can reduce the pre-charge time without dividing the source line SL. In other words, with the present embodiment, it becomes possible to increase the reading speed without increasing the scale of the circuit.

For the reasons explained above, the flash memory relating to the present embodiment can perform rewriting and reading at high speeds, and has superior read disturb resistance and a small scale circuit.

Moreover, the present embodiment was explained using an example of flash memory wherein a single share source line SL is connected to the sources of every FAMOS transistor T00 through Tnm in the memory cell array. However, the effects discussed above can also be attained in the case of having this common source line divided among a plurality of rows or a plurality of columns. In this case as well, the load on each source line (junction resistance of the FAMOS transistors T00 through Tnm) becomes greater than in the case where the common source line is divided among single rows or single columns and therefore application of the driver circuit shown in FIG. 2 is valid. In this case, it is preferable to establish a decoder for selecting the divided source lines, but the constitution of such a decoder is simpler than in the case of dividing the source line among single rows or single columns and therefore the scale of the circuit for the flash memory as a whole is smaller.

Furthermore, the present embodiment was explained using an example wherein the memory cell array comprises a single memory cell block. However, this invention can of course be applied to flash memory wherein the memory cell array comprises a plurality of memory cell blocks.

Second Embodiment

The second embodiment is explained below using FIGS. 4 and 5 and employing an example of the case where the present invention is applied to flash memory.

The present embodiment is an example performing charging acceleration when starting to read stored data and transitioning the read address.

The overall constitution of the flash memory relating to the present embodiment is the same as in FIG. 1 and an explanation thereof is omitted.

Figure 4:
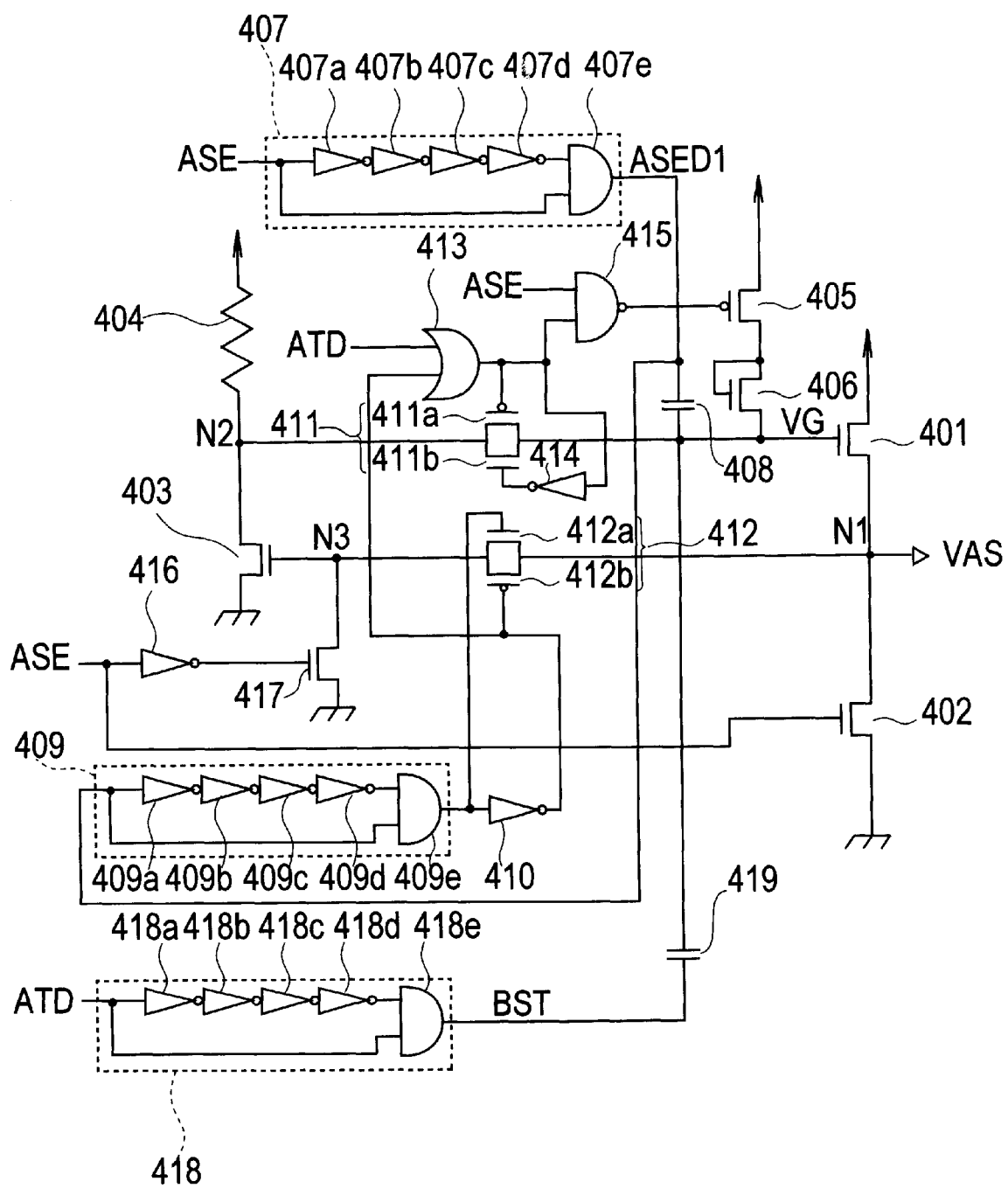
FIG. 4 is a circuit diagram showing the internal constitution of the driver circuit relating to the second embodiment.
Figure 5:
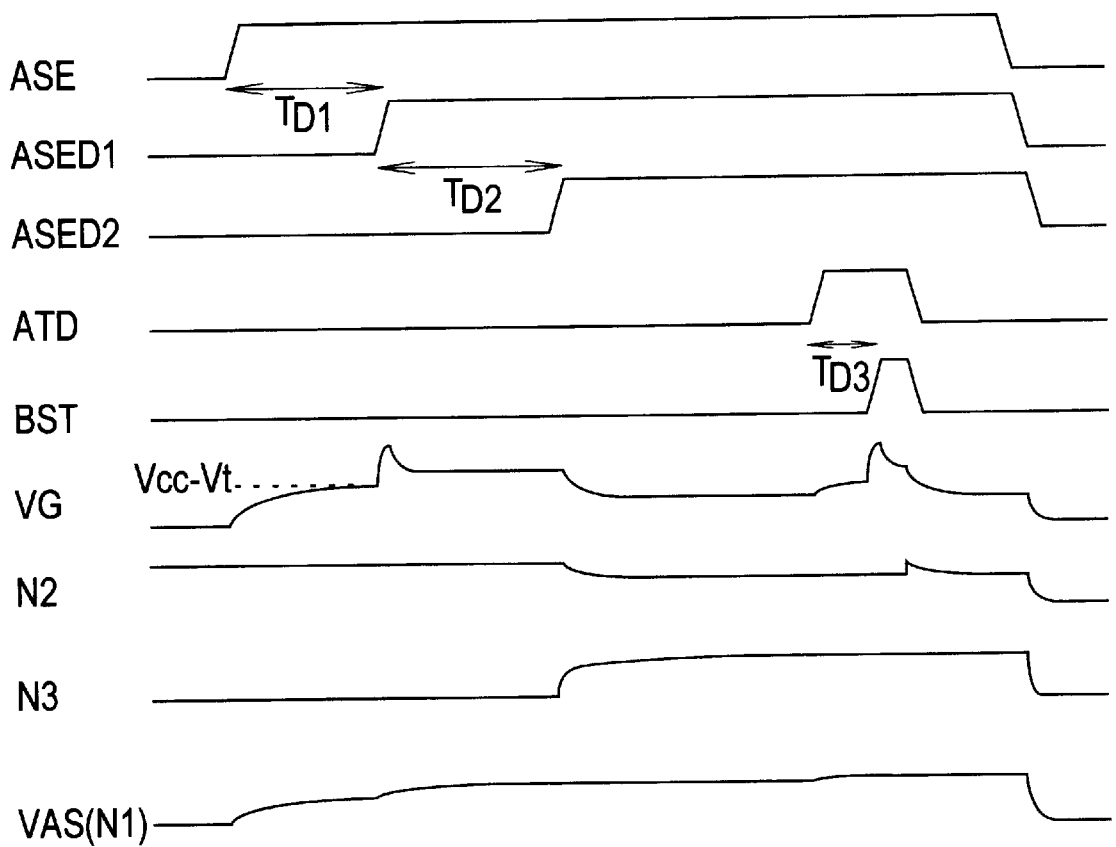
FIG. 5 is a timing chart for explaining the operation of the driving driver circuit relating to the second embodiment.

FIG. 4 is a circuit diagram showing the internal constitution of the driver circuit relating to the present embodiment.

In FIG. 4, the nMOS transistor 401 is connected by its gate to the node N2 through the transfer gate 411, by its source to the power line Vcc, and by its drain to the node N1. The nMOS transistor 402 receives the drive control signal ASE through its gate, is connected by its source to the ground line GND, and by its drain to node N1. As in the first embodiment, the potential of the node N1 becomes the driving voltage VAS applied to the source line SL (see FIG. 1).

The nMOS transistor 403 is connected by its gate to node N1 through the transfer gate 412, by its source to the ground line GND, and by its drain to the node N2. One end of the resistor element 404 is connected to the power line Vcc and the other end is connected to the node N2.

The pMOS transistor 405 is connected by its gate to the output terminal of the NAND circuit 415, and by its source to the power line Vcc. The diode-connected nMOS transistor 406 is connected by its gate and drain to the drain of the pMOS transistor 405 and by its source to the gate of the nMOS transistor 401.

The delay circuit 407 comprises four serially connected NOT circuits 407a through 407d and an AND circuit 407e. Through one input terminal, the AND circuit 407e receives the drive control signal ASE via the NOT circuits 407a through 407d and receives the drive control signal ASE directly through the other input terminal. In the following explanation, the delay time due to the delay circuit 407 is TD1.

One end of the capacitor 408 is connected to the output terminal of the delay circuit 407 and the other end is connected to the gate of the nMOS transistor 401.

The delay circuit 409 comprises four serially connected NOT circuits 409a through 409d and an AND circuit 409e. One input terminal of the AND circuit 409e is connected to the output terminal of the delay circuit 407 via the NOT circuits 409a through 409d. Meanwhile, the other input terminal of the AND circuit 409e is connected directly to the output terminal of the delay circuit 407. In the following explanation, the delay time due to the delay circuit 409 is TD2.

The input terminal of the NOT circuit 410 is connected to the output terminal of the delay circuit 409.

The transfer gate 411 comprises a pMOS transistor 411a and an nMOS transistor 411b. The pMOS transistor 411a is connected by its gate to the output terminal of the OR circuit 413, by its source to the node N2, and by its drain to the gate of the nMOS transistor 401. Also, the nMOS transistor 411b is connected by its gate to the output terminal of the OR circuit 413 via the NOT circuit 414, by its source to the gate of the nMOS transistor 401, and by its drain to the node N2.

The transfer gate 412 comprises an nMOS transistor 412a and a pMOS transistor 412b. The nMOS transistor 412a is connected by its gate to the output terminal of the delay circuit 409, by its source to the gate of the nMOS transistor 403, and by its drain to the node N1. The pMOS transistor 412b is connected by its gate to the output terminal of the NOT circuit 410, by its source to the node N1, and by its drain to the gate of the nMOS transistor 403 in the node N3.

One input terminal of the OR circuit 413 is connected to the output terminal of the NOT circuit 410 and the address transition signal ATD is input through the other input terminal.

One input terminal of the NAND circuit 415 is connected to the output terminal of the OR circuit 413 and the drive control signal ASE is input through the other input terminal.

The NOT circuit 416 receives the drive control signal ASE through the input terminal. The nMOS transistor 417 is connected by its gate to the output terminal of the NOT circuit 416, by its source to the ground line GND, and by its drain to the gate of the nMOS transistor 403 in the node N3.

The delay circuit 418 comprises four serially connected NOT circuits 418a through 418d and an AND circuit 418e. Through one input terminal, the AND circuit 418e receives the address transition signal ATD via the NOT circuits 418a through 418d and directly receives the address transition signal ATD through the other input terminal. In the following explanation, the delay time due to the delay circuit 418 is TD3.

One end of the capacitor 419 is connected to the output terminal of the delay circuit 418 and the other end is connected to the gate of the nMOS transistor 401.

The operation of the flash memory relating to the present embodiment is explained next using FIG. 5.

When the read operation for the flash memory is not being executed, the drive control signal ASE and the address transition signal ATD remain at low level. When the drive control signal ASE is at low level, the output of the NAND circuit 415 is high level and therefore the pMOS transistor 405 is off and does not supply potential to the gate of the nMOS transistor 401. At this time, the transfer gates 411, 412 are closed. Also, the nMOS transistors 401, 402 are off because the gate potentials are at low level.

Once the drive control signal ASE becomes high level in order to start the operation for reading the flash memory, the pMOS transistor 402 is turned on. Next, the output of the NAND circuit 415 becomes high level and for this reason, the pMOS transistor 405 is turned on. Consequently, Vcc-Vt (Vt is the voltage drop across the nMOS transistor 406) is applied to the gate of the nMOS transistor 401. The nMOS transistor 401 is thereby turned on and consequently the potential of the node N1, meaning the driving voltage VAS, rises to a value described by the source voltage Vcc divided by the on resistance ratio of the nMOS transistors 201, 202. When the drive control signal ASE becomes high level, the nMOS transistor 417 is turned off and for this reason, the gate of the nMOS transistor 403 enters a floating state. At this time, the potential of the node N2 remains at Vcc.

After the time TD1 has elapsed from when the drive control signal ASE becomes high level, the output signal ASED1 of the delay circuit 407 changes from low level to high level. Consequently, the potential at one end of the capacitor 408 rises rapidly from 0 Volts to Vcc. Thereby, the potential at the other end of the capacitor 408 (the gate potential of the nMOS transistor 401) rises rapidly by Vcc and becomes 2 Vcc-Vt and thereafter slowly decreases. Thereby, the charge supplied to the source line SL (see FIG. 1) from the node N1 also rapidly increases and the rise of the driving voltage VAS is accelerated thereby.

After the time TD2 has elapsed from when the signal ASED1 becomes high level, the output signal ASED2 of the delay circuit 409 changes from low level to high level and consequently the output of the OR circuit 413 changes from high level to low level. Thereby, the transistors of the transfer gates 411, 412 turn on and then the output of the NAND circuit 415 becomes low level. Consequently, as in the first embodiment, the gate potential of the nMOS transistor 401 is provided by the node N2 and the gate potential of the nMOS transistor 403 is provided by the node N1. Then, due to the same negative feedback operation as in the first embodiment, the potential of the node N1, meaning the driving voltage VAS, converges on a value determined by the dimension of the nMOS transistors 401, 402, 403, and the resistor element 404.

When the pre-charging of the source line SL is executed as discussed above, data reading using the row decoder 101 and the column decoder 102 (see FIG. 1) is started.

In the flash memory in the present embodiment, the reading of data is effected from all of the FAMOS transistors associated with a selected word line. In other words, read data of 0 or 1 are output to all of the bit lines BL0 through BLm. From among these read data, only the read data corresponding to the selected deadline are input to the sense amplifier 105. The following explanation is made using an example wherein the state where in charge is accumulated in the floating gate is 1 and the state wherein charge is not accumulated in the floating gate is 0.

When the word line potential has become high level, the FAMOS transistor wherein charge is not accumulated in the floating gate (meaning FAMOS transistor with a storage value of 0) is turned on and the FAMOS transistors wherein charge is accumulated in the floating gate (meaning FAMOS transistors with a storage value of 1) remain off. In the case where the FAMOS transistor is turned on, the corresponding bit line is charged by the accumulated charge in the source line SL and becomes high level. Meanwhile, in the case where the FAMOS transistors remain off, the corresponding bit lines are not charged and remain low level. However, in the case where a word line with a very large number of FAMOS transistors having a storage value of 0 is selected, a very large number of bit lines must be charged and for this reason it is not possible to quickly raise the potential of these bit lines. In the case where the potential of a bit line corresponding to a storage value of 0 is not raised to the threshold value of ½ Vref within the data reading period, the sense amplifier 105 mistakes the value of the read data.

Consequently, in the case of using a normal driver circuit, the data reading period must be made sufficiently long in order to ensure the reliability of the read data. This becomes an obstacle to increasing the reading speed.

In the flash memory relating to the present embodiment, charging acceleration is performed as follows when the reading address is transitioned.

At the transition of the address, the address transition signal ATD (see FIGS. 4 and 5) changes from low level to high level. The output of the OR circuit 413 thereby changes from low level to high level and consequently the transistors of the transfer gate 411 turn off. Also, when the address transition signal ATD becomes high level, the output of the NAND circuit 415 becomes low level and consequently the pMOS transistor 405 is turned on. The gate potential VG of the nMOS transistor 401 thereby becomes Vcc-Vt.

When the time TD3 passes from when the address transition signal ATD becomes high level, the output signal BST of the delay circuit 418 changes from low level to high level. The potential at one end of the capacitor 419 thereby rapidly rises from 0 Volts to Vcc. Consequently, the potential of the other end of the capacitor 419 (meaning the gate potential of the nMOS transistor 401) also rises abruptly by Vcc, becomes 2Vcc-Vt, and thereafter slowly drops. The charge supplied from the node N1 to the source line SL (see FIG. 1) thereby increases rapidly.

Thereafter, once the address transition signal ATD becomes low level, the output of the delay circuit 418 immediately becomes low level and the acceleration of charging of the source line SL ends.

As explained above, the flash memory relating to the present embodiment can reduce the pre-charging time for the source line SL as in the first embodiment.

In addition, with the driver circuit relating to the present embodiment, the amount of charge output during the address transition can be temporarily increased and consequently, even in the case where a word line having a very large number of FAMOS transistors with a storage value of 0 is selected, it becomes possible to rapidly raise the potential of the corresponding bit lines. For this reason, in the flash memory relating to the present embodiment, the reliability of the values read is not lost even if the reading data reading period is reduced. Consequently, with the flash memory relating to the present embodiment, reading speed can be made faster than the flash memory relating to the first embodiment.

Moreover, like the first embodiment, the present embodiment may be applied to flash memory wherein the common source line is divided into source lines for a plurality of rows or a plurality of columns.

In addition, the flash memory relating to the present embodiment can be applied to flash memory wherein the memory cell array comprises a plurality of memory cell blocks.

As discussed in detail above, the present invention is able to provide a semiconductor memory device wherein reading and writing can be performed at high speeds, having good read disturb resistance and a small scale circuit.

What is claimed is:

1. A semiconductor memory device comprising:
   a memory cell block having floating gate transistors disposed in a matrix form;
   a plurality of first selector lines each connected to the control gates of said floating gate transistors in the same row;
   a plurality of second selector lines each connected to the first terminal of said floating gate transistors in the same column;

a common line connected to the second terminals of said floating gate transistors in a plurality of rows or a plurality of columns; and a driver circuit for performing normal charging for supplying the read potential to said common line, and accelerated charging for temporarily increasing the quantity of charging charge supplied to said common line;

wherein said driver circuit performs said accelerated charging at the start of the charging of said common line and performs said normal charging after the passage of a prescribed time from the start of charging.

2. The semiconductor memory device, according to claim 1, said driver circuit comprises:

a first transistor which receives a first source potential at one end and which is connected to said common line at the other end;

a second transistor which receives a second source potential at one end and which is connected to said common line at the other end; and a first control circuit for switching between said accelerated charging and said normal charging by switching the gate potential of said first transistor.

3. The semiconductor memory device, according to claim 2, wherein said first control circuit performs said accelerated charging by applying a first gate potential to the gate terminal of said first transistor and then raising the potential of this gate terminal from said first gate potential to a second gate potential.

4. The semiconductor memory device, according to claim 3, wherein said first control circuit comprises:

a first transistor circuit which receives the drive control signal and applies said first gate potential to said gate terminal of said first transistor;

a first capacitor one end of which is connected to said gate terminal of said first transistor; and a first delay circuit for raising said gate potential of said first transistor to said second gate potential by applying a prescribed potential to the other end of said first capacitor after the passage of a first delay time from the input of said drive control signal.

5. The semiconductor memory device, according to claim 2, wherein said first control circuit comprises a negative feedback circuit for stabilizing the potential of said common line during normal discharge.

6. The semiconductor memory device, according to claim 5, wherein said negative feedback circuit comprises:

a resistor element which receives said first source potential at one end and which is connected to the gate terminal of said first transistor at the other end; and a third transistor which is connected to said other end of said resistor element at one end, receives said second source potential at the other end, and is connected to said common line at its gate terminal.

7. The semiconductor memory device, according to claim 6, wherein said negative feedback circuit comprises:

a first transfer gate for separating said other end of said resistor element and said one end of said third transistor from said gate terminal of said first transistor; and a second transfer gate for separating said gate terminal of said third transistor from said common line.

8. The semiconductor memory device, according to claim 7, wherein said first control circuit comprises a gate potential stabilizing circuit for stopping said first transistor circuit and opening said first and second transfer gates after the passage of said prescribed time from the start of said charging.

9. The semiconductor memory device, according to claim 8, wherein said gate potential stabilizing circuit comprises a second delay circuit for delaying, by a second delay time, the signal input from said first delay circuit and outputting this signal to said first and second transfer gates.

10. A semiconductor memory device comprising:

a memory cell block having floating gate transistors disposed in a matrix form;

a plurality of first selector lines each connected to the control gates of said floating gate transistors in the same row;

a plurality of second selector lines each connected to the first terminal of said floating gate transistors in the same column;

a common line connected to the second terminals of said floating gate transistors in a plurality of rows or a plurality of columns; and a driver circuit for performing normal charging for supplying the read potential to said common line, and accelerated charging for temporarily increasing the quantity of charging charge supplied to said common line;

wherein said driver circuit executes said accelerated charging function during the transition of the reading address of the stored data.

11. The semiconductor memory device, according to claim 10, wherein said driver circuit comprises:

a first transistor which receives a first source potential at one end, and which is connected to said common line at the other end;

a second transistor which receives a second source potential at one end, and which is connected to said common line at the other end; and a second control circuit for switching between said accelerated charging and said normal charging by switching the on the gate potential of said first transistor.

12. The semiconductor memory device, according to claim 11, wherein said second control circuit performs said accelerated charging by applying a first gate potential to the gate terminal of said first transistor and then raising the potential of this gate terminal from said first gate potential to a second gate potential.

13. The semiconductor memory device, according to claim 12, wherein said second control circuit comprises:

a second transistor which receives the address transition signal and applies said first gate potential to said gate terminal of said first transistor;

a second capacitor with one end connected to said gate terminal of said first transistor; and a third delay circuit for raising said gate potential of said first transistor to said second gate potential by applying the prescribed potential to the other end of said second capacitor after the passage of a third delay time from the input of said address transition signal.

14. The semiconductor memory device, according to claim 1, wherein said transistors are floating gate avalanche metal oxide semiconductor transistors.

15. The semiconductor memory device, according to claim 1, wherein said memory cell block is constituted by flash memory.

16. The semiconductor memory device, according to claim 1, wherein said common line is connected in common to all of said transistors in said memory cell block.

17. The semiconductor memory device, according to claim 1, wherein said common line is divided into a plurality of common lines connected to said floating gate transistors in a plurality of rows or a plurality of columns.

18. The semiconductor memory device, according to claim 1, comprising a plurality of said memory cell blocks.

* * * * *